(12) United States Patent
Hassell et al.

(10) Patent No.: US 11,693,031 B2
(45) Date of Patent: Jul. 4, 2023

(54) ELECTRIC METER COLLAR ADAPTOR TO DIVERT POWER TO DISTRIBUTED POWER GENERATION RESOURCES

(71) Applicant: INFINITE INVENTION INC., Falls Church, VA (US)

(72) Inventors: Sebastian Hassell, Falls Church, VA (US); John Schroeder, Falls Church, VA (US); Jon Knauer, Falls Church, VA (US); Katie Bentley, Falls Church, VA (US); Whitman Fulton, Falls Church, VA (US)

(73) Assignee: INFINITE INVENTION INC., Falls Church, VA (US)

(*) Notice: Subject to any disclaimer, the term of this patent is extended or adjusted under 35 U.S.C. 154(b) by 0 days.

(21) Appl. No.: 17/455,104

(22) Filed: Nov. 16, 2021

(65) Prior Publication Data

US 2022/0155350 A1    May 19, 2022

Related U.S. Application Data

(60) Provisional application No. 63/114,161, filed on Nov. 16, 2020.

(51) Int. Cl.
*G01R 11/04* (2006.01)
*H01R 31/06* (2006.01)

(52) U.S. Cl.
CPC .............. *G01R 11/04* (2013.01); *H01R 31/06* (2013.01); *H01R 2201/20* (2013.01)

(58) Field of Classification Search
CPC ................................ G01R 11/04; H01R 31/06
See application file for complete search history.

(56) References Cited

U.S. PATENT DOCUMENTS

| | | | |
|---|---|---|---|
| 2013/0106397 A1* | 5/2013 | Fulton | H01R 33/945 439/517 |
| 2020/0379021 A1* | 12/2020 | Karlgaard | G01R 22/061 |

* cited by examiner

*Primary Examiner* — Minh Q Phan
(74) *Attorney, Agent, or Firm* — Hamre, Schumann, Mueller & Larson, P.C.

(57) ABSTRACT

A meter collar is an adapter that may be inserted between a meter socket box and the meter. The meter collar may include a housing that is provided with first contacts to facilitate a mechanical and electrical connection with utility-side contacts of the meter socket box and second contacts to facilitate a mechanical and electrical connection with customer-side contacts of the meter socket box.

10 Claims, 7 Drawing Sheets

ELECTRIC METER COLLAR ADAPTOR TO DIVERT POWER TO DISTRIBUTED POWER GENERATION RESOURCES

TECHNICAL FIELD

The embodiments described and recited herein pertain, generally, to electrical power interconnection and management.

BACKGROUND

Distributed power generation systems (alternatively "DPGS") are typically small, i.e., less than 1MW, power generators that are connected directly to local electric distribution grids. Conventional large power plants that are typically connected to the high-voltage electric transmission grid. Examples of a DPGS include solar cell arrays, battery or fuel-cell storage systems, electric vehicles, and small wind turbines.

SUMMARY

In accordance with an example embodiment, a consumer-side power distributor includes an interface to electrically interface with a public utility-facing meter socket which diverts the power to an energy management system.

In accordance with another example embodiment, a power management system, includes an electrical meter socket, a distributed power generation system diverter (DPGS) removably connected to the electrical meter socket, the DPGS diverter including contacts to connect with a utility-side of a meter socket box, contacts to connect with a consumer-side of the meter socket box, and an electrical meter removably connected to the meter collar.

BRIEF DESCRIPTION OF DRAWINGS

In the detailed description that follows, embodiments are described as illustrations only since various changes and modifications will become apparent to those skilled in the art from the following detailed description. The use of the same reference numbers in different FIGS. indicates similar or identical items.

DETAILED DESCRIPTION

In the following descriptions, reference is made to the following drawings, which form a part hereof. In the drawings, similar symbols typically identify similar components, unless content dictates otherwise. In the case of all illustrations, solid lines are used to represent physical components and housings, dashed lines represent electrical wiring paths that would typically be multiple power conductors as well as neutral and ground wires. The illustrative embodiments described in the description, drawings, and claims are not meant to be limiting. Other embodiments may be utilized, and other changes may be made, without departing from the spirit or scope of the subject matter presented herein. It will be readily understood that the aspects of the present disclosure, as generally describes herein, and illustrated in the FIGS., may be arranged, substituted, combined, separated, and designed in a wide variety of different configurations, all of which are explicitly contemplated herein.

The embodiments described and recited herein provide a point of interconnection incorporated into a meter socket collar of a utility meter on both or either of the utility or the consumer side of the utility meter.

A meter collar is an adapter that may be inserted between a meter socket box and the meter. As described and recited herein, a meter collar may include a housing that is provided with first contacts to facilitate a mechanical and electrical connection with utility-side contacts of the meter socket box and second contacts to facilitate a mechanical and electrical connection with customer-side contacts of the meter socket box.

In accordance with embodiments described and recited herein, a meter collar adaptor with whole site electrical mains rerouting capabilities may be installed between a meter socket base and a meter to mechanically reroute the flow of power on the customer or utility side of the meter through GDPS assets and then return power to the meter collar. Such a meter collar adaptor may be referred to as a GDPS Diverter, herein.

During normal operation, with the power from the electrical grid available, power may be fed from a break in the mains power in the diverter and then may be routed to a smart combiner. In normal operation mode, grid power in addition to any GDPS contributions, e.g., solar power or surplus battery power, may be fed back through the diverter, which may then be connected to the main electrical panel.

In accordance with at least some of the non-limiting embodiments described and recited herein, a diverter interconnection may be made on either the line side or the load side of the utility meter thus enabling metered or non-metered energy management system installations.

The GDPS connection may be established through a pluggable interface to facilitate installation of the collar and maintenance of the meter socket.

A bypass switch may be incorporated into the DPGS diverter to facilitate the flow of power to a load side of the service when the energy management system is disconnected. This bypass may be a make before break type of connection that will not interrupt power to the residence and will reduce the chance of arcing while mating or removing the plug.

Figure 1:
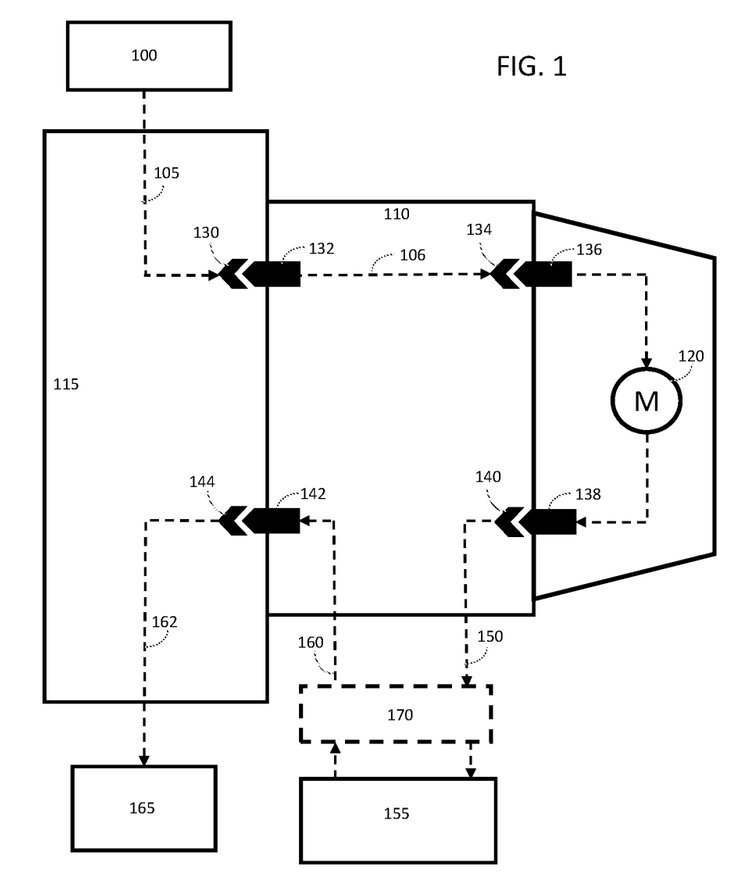
FIG. 1 shows a general configuration of a meter system having a GPDS diverter, in accordance with one or more example embodiments described and recited herein.

FIG. 1 shows a general configuration of a meter system having a GPDS diverter, in accordance with one or more example embodiments described and recited herein. The one-line diagram of the system includes electric utility 100 and GPDS diverter 110.

Power may flow from electrical utility 100 through wires 105 into electrical meter socket 115. Wires 105 are connected to line-side meter socket terminal jaws 130. GPDS diverter 110 includes terminal stabs 132 that may mechanically and electrically connect with meter socket jaws 130. Power may flow from stab 132 through busbar 106 to terminal jaw 134, at which a utility meter stab 136 mechanically and electrically connects to jaw 134. Power may flow though meter 120 and back to GPDS diverter 110 through meter stab 138, when mechanically and electrically connected to terminal jaw 140.

Accordingly, power may be rerouted out of GPDS diverter 110, via wires 150, and routed to power management system 155 directly or, optionally, via interconnection junction box 170.

Power may then return from power management system 155, via wires 160, which may be connected to load side terminal stabs 142 that are mechanically and electrically connected to meter socket load side jaws 144. Socket load side jaws 144 may be connected to wires 162 that route power to residential main load panel 165. The rerouting the power at the meter collar enables a pluggable interface for the installation and maintenance of energy management systems.

Figure 2A:
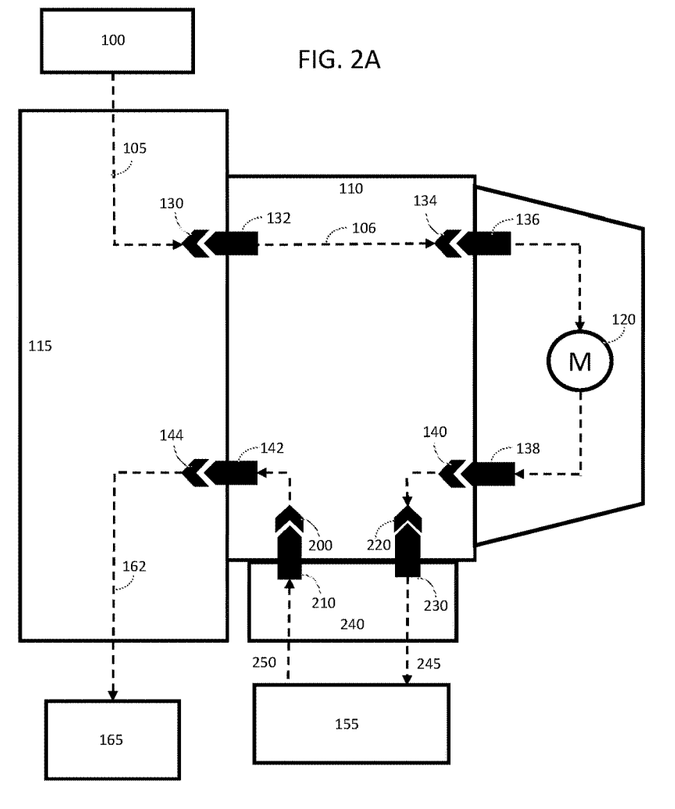
FIG. 2A illustrates a pluggable embodiment of the GPDS diverter, with the plug inserted, in accordance with one or more example embodiments described and recited herein.
Figure 2B:
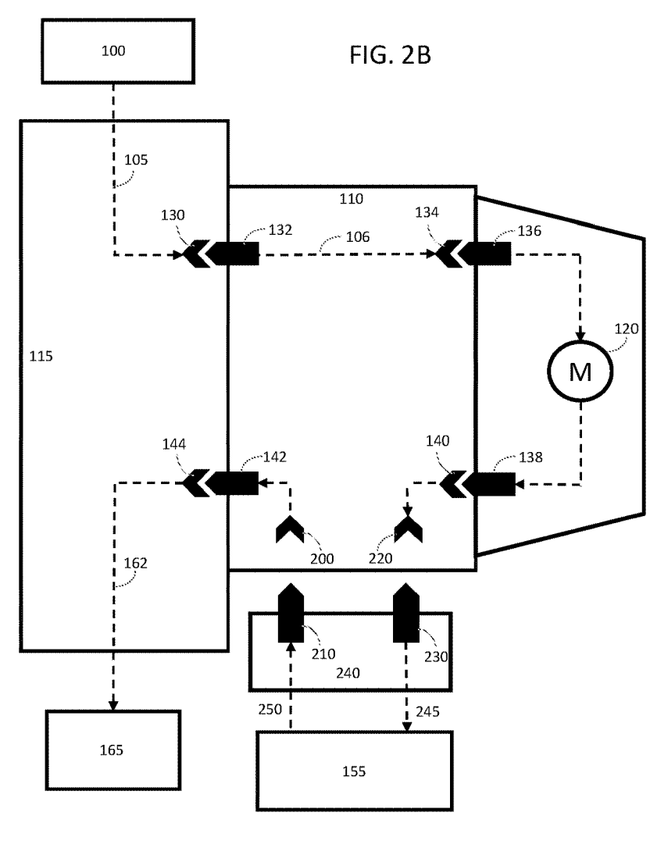
FIG. 2B illustrates a pluggable embodiment of the GPDS diverter, with the plug removed, in accordance with one or more example embodiments described and recited herein.

FIG. 2A illustrates a pluggable embodiment of the GPDS diverter, with the plug inserted; and FIG. 2B illustrates a pluggable embodiment of the GPDS diverter, with the plug removed, in accordance with one or more example embodiments described and recited herein.

Further to the non-limiting example embodiment of FIG. 1, plug 240 may include plug stabs 210 and 230, which may be mechanically inserted into GDPS housing 110 and electrically connected to plug sockets 200 and 220. Therein, utility power may flow from socket jaw 140 to plug jaw 220 then to plug stab 230. Power may then further flow though wire 245 to energy management system 155. Power may return from energy management system 155 through wire 250 to plug stab 210. Power may further flow into plug jaw 200 and return to a load side of meter socket 115 through GPDS stab 142 and meter socket jaw 144.

Incorporating plug 240 into GPDS diverter 110 may facilitate installation and maintenance of system by allowing adaptor collar 110 to be de-coupled from the energy management system 155 and recoupled subsequently.

Plug 240 may include plug stabs 210 and 230 that may carry a rated service load when mechanically and electrically mated with plug receptacle jaws 200 and 220 in DPGS diverter 110. Plug stabs 210 and 230 may be connected to cables 245 and 250 that convey power to energy management system 155. Cables 250 and 245 may be encased in an armored flexible conduit between plug 240 and the energy management system 155, which may facilitate insertion and removal of the plug during installation and maintenance of the system. Plug 240 and DPGS diverter 110 may have a set of stabs and jaws for each electrical phase leg of the service entering the residence.

The plug 240 may facilitate different installation and maintenance use scenarios. Firstly, installation of adaptor collar 110 into a ringless meter socket may be facilitated by removing appendages, e.g., cables or junction boxes, from the adaptor collar 110 so the adaptor collar 110 can be slipped through the ringless meter socket front panel.

Secondly, decoupling DPGS diverter 110 from energy management system 115 may facilitate placement of the separated DPGS diverter 110 and energy management system 115 components at different times which enables multiple system commissioning sequences.

Thirdly, maintenance of the meter socket 115, GPDS Diverter 110, or energy management system 155 may include removal of the plug facilitates access to GPDS Diverter collar 110 and meter socket 115. Plug 240 may be inserted into the GPDS diverter collar 110 after collar 110 is installed in the meter socket 115, the energy management system 155 is placed, and wired to the plug 240. Once plug 240 is inserted into the GPDS diverter collar 110, the plug may be locked in place to secure access to GPDS diverter collar 110 electrical contacts 200 and 220.

Figure 3A:
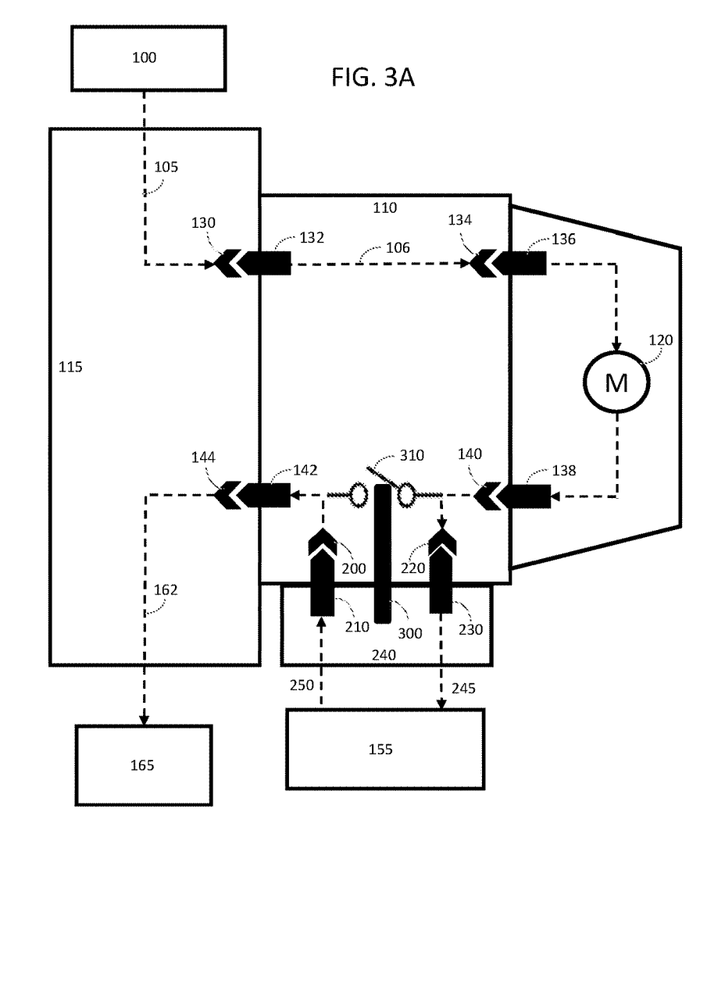
FIG. 3A illustrates a GPDS diverter that incorporates a bypass switch that is opened when a plug is inserted, in accordance with one or more example embodiments described and recited herein.
Figure 3B:
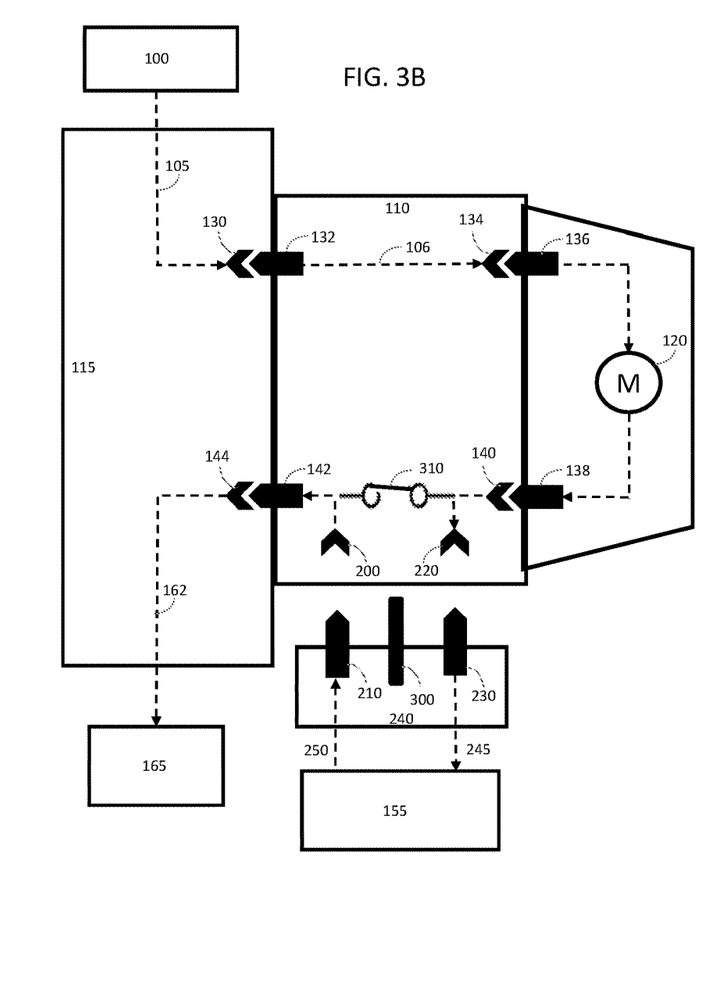
FIG. 3B illustrates a GPDS diverter that incorporates a bypass switch that is shut when a plug is removed, in accordance with one or more example embodiments described and recited herein.

FIG. 3A Illustrates a GPDS diverter that incorporates a bypass switch that is opened when a plug is inserted; and FIG. 3B Illustrates a GPDS diverter that incorporates a bypass switch that is shut when a plug is removed, both in accordance with one or more example embodiments described and recited herein.

Further to the non-limiting example embodiments of FIGS. 1, 2A, and 2B, GPDS diverter 110 may incorporate bypass switch 310 to supply power to a residence main load panel 165 when plug 240 is removed.

FIG. 3A shows plug 240 inserted into GPDS diverter 110. Plug 240 may include an integral actuator 300 to open bypass switch 310. When bypass switch 310 is open, utility power may be routed through plug 240 to energy management system 155.

FIG. 3B shows plug 240 removed from GPDS diverter 110. This removes the plug's 240 integral actuator 300 and allows the bypass switch 310 to shut. With bypass switch 310 shut, utility power may flow through bypass switch 310 to load side jaw 144 of meter socket 115 and provide power to residence main load panel 165.

Bypass switch 310 may facilitate installation of DPDS collar 110 while maintaining utility power service to a residence, even when the energy management system is not plugged in. In addition, if switch 310 and plug jaws 200, 220 and plug stabs 210, 230 are make-before-break, arcing between the contacts while inserting or removing the plug may be prevented.

As referenced herein, make-before-break may refer to a set of electrical contacts that shut or make contact before a separate set of electrical contacts open or break contact. In the GPDS diverter 110 bypass switch 310 example, when plug 240 is inserted into GPDS diverter 110 contacts 210 and 200, contacts 230 and 220 contact before the bypass switch 310 breaks contact. Conversely, when the plug 240 is removed from the GPDS diverter 110 bypass switch 310 will make contact before the contacts 210 and 200, contacts 230 and 220 break contact.

As referenced herein, arcing may refer to current continuing to flow between contacts as they are being pulled apart thus creating an electrical arc between the contacts. This condition deteriorates the surface of the contacts and can lead to poor electrical performance over time. Without the make-before-break configuration of bypass switch 310 and plug 240, arcing could occur at the contacts 210 and 200, contacts 230 and 220, or the switch 310.

FIGS. 1-3 provide multiple embodiments of a meter collar adaptor with whole site electrical mains rerouting capabilities, herein referred to as "GDPS diverter", that may be installed between a meter socket base and a meter to mechanically reroute a flow of power on the customer or utility side of the meter through GDPS assets, then returning power to the meter collar. A GPDS Diverter may facilitate installation of an energy management system at a service entrance of a residence or facility.

More particularly, FIGS. 2A, 2B, 3A, and 3B show different embodiments of a GDPS connection established through a pluggable interface that provide dynamic and efficient installation of the collar and maintenance of the meter socket much more convenient.

FIGS. 3A and 3B show that a bypass switch may be incorporated into the GDPS diverter that will allow power to flow to the load side of the service when the energy management system is disconnected. This bypass may be a make before break type of connection that will not interrupt power to the residence. In addition, the bypass will reduce the chance of arcing while mating or removing the plug.

Figure 4:
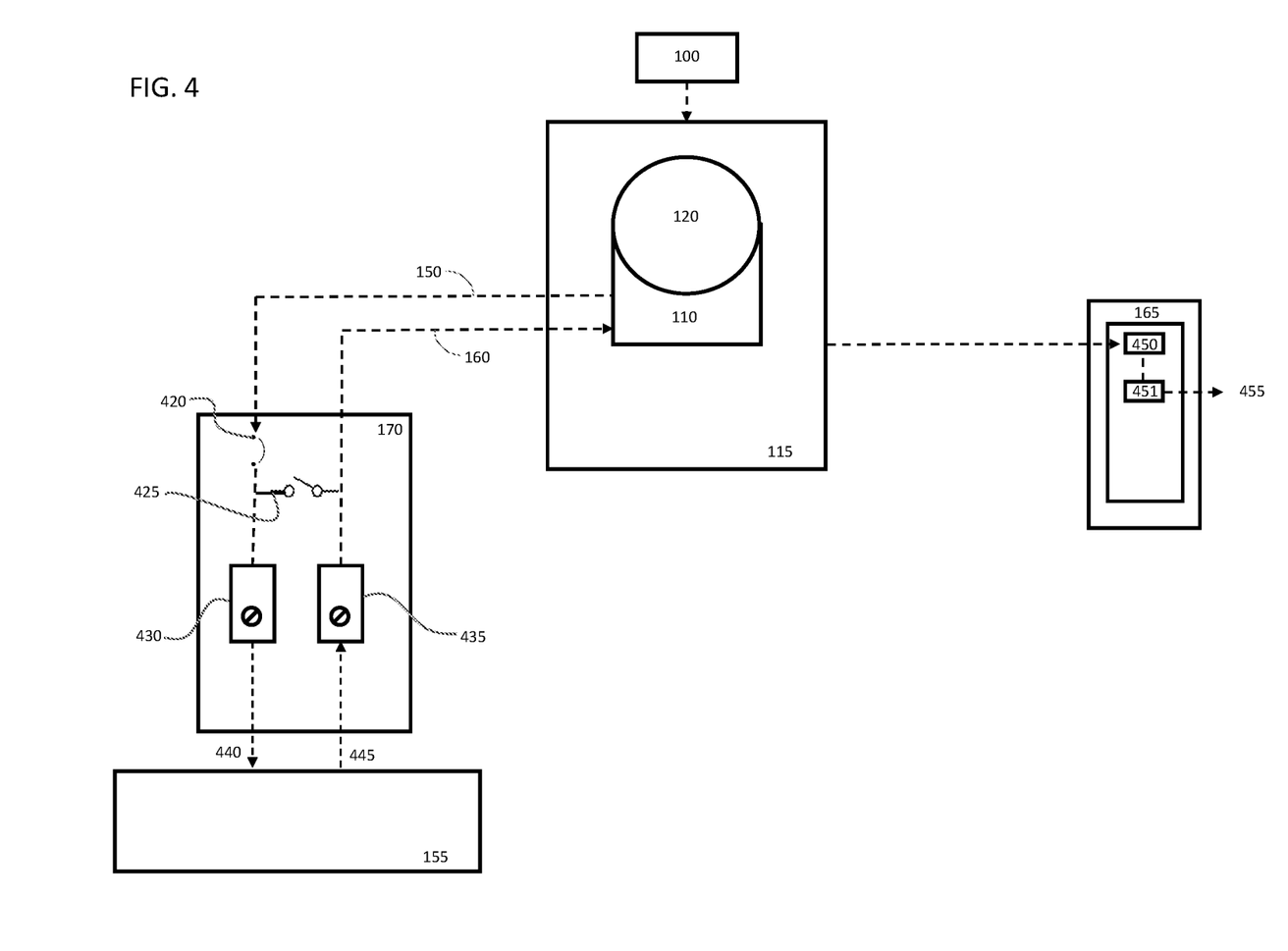
FIG. 4 illustrates an overview of the diverter wired to an external junction box, in accordance with one or more example embodiments described and recited herein.

FIG. 4 illustrates an overview of a diverter wired to an external junction box, in accordance with one or more example embodiments described and recited herein. Further to the embodiments of FIGS. 1-3, DPGS collar 110 may be factory wired to separate junction box 170 mounted remotely from DPGS collar 110.

Power may flow from GPDS collar 110, via wires 150, to the junction box 170. Power may be returned to DPGS collar 110, via wires 160. Junction box 170 may house lugs 430 and 435 for field wiring the power to the energy management system 155, via cables 440 and 445; switch gear components including a circuit breaker 420 to provide circuit protection for the utility service 100; and bypass switch 425, which may facilitate provision of power to a residence or facility when energy management system 155 is disconnected.

Figure 5A:
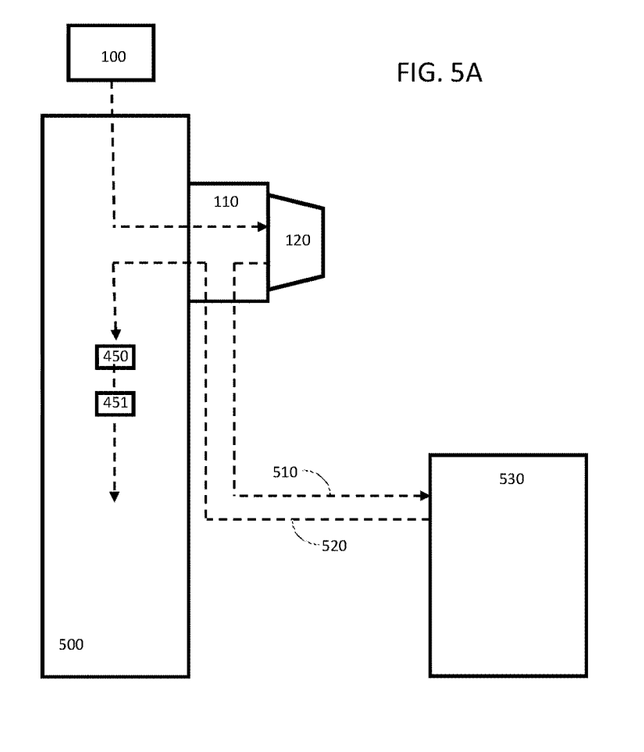
FIG. 5A illustrates an additional configuration of an energy management system installed on a load side of with a meter plus AC load center panel and a GDPS diverter, in accordance with one or more example embodiments described and recited herein.

FIG. 5A illustrates an additional configuration of an energy management system installed on a load side of with a meter plus AC load center panel and a GDPS diverter, in accordance with one or more example embodiments described and recited herein. The power flow path shown in FIG. 5A may be implemented in accordance with any of the embodiments of FIGS. 1-4.

In FIG. 5A, GDPS diverter 110 has a load side connection at which energy management system 530 may be powered load side of the utility meter 120. Power may flow from utility 100 to combined breaker and meter socket 500, through GDPS diverter 110 and through the utility meter 120, then exits GPDS diverter 110 via load side wires 510 to supply power to energy management system 530. Power may then flow from energy management system 530 through wires 520 back to GPDS diverter 110 and returns to the combined breaker and meter socket 500, which supplies power to the residence loads through circuit breakers 450 and 451.

Figure 5B:
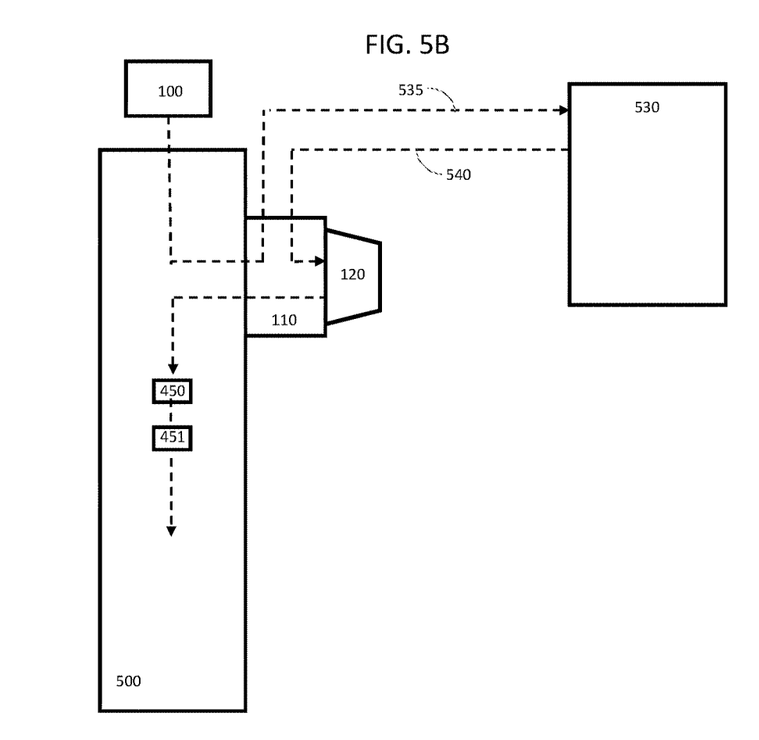
FIG. 5B illustrates an additional configuration of an energy management system installed on a line side of with a meter plus AC load center panel and a GDPS Diverter, in accordance with one or more example embodiments described and recited herein.

FIG. 5B illustrates an additional configuration of an energy management system installed on a line side of with a meter plus AC load center panel and a GDPS Diverter, in accordance with one or more example embodiments described and recited herein. The power flow path shown in FIG. 5B may be implemented in accordance with any of the embodiments of FIGS. 1-4.

In FIG. 5B, GDPS diverter 110 has a line side connection at which energy management system 530 is powered by a line side of utility meter 120. Power may flow from the utility 100 to the combined breaker and meter socket 500, through the GDPS diverter 110, then exits the GPDS diverter 110 through wires 535 to supply the energy management system 530. The power then flows from the energy management system 530 through wires 540 back to the GPDS diverter 110, through the utility meter 120, and returns to the meter socket 500 which supplies the residence loads through circuit breakers 450 and 451.

Figure 6A:
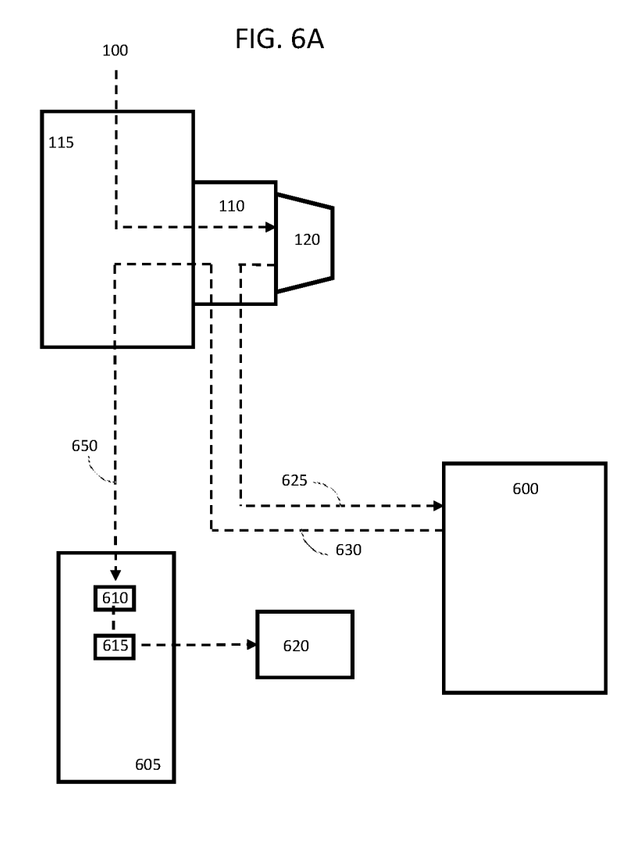
FIG. 6A illustrates a side angle view of an energy management system installed in conjunction with a residential standalone meter socket and separate load center AC panel with a GDPS Diverter interrupting power on a load side of a meter, in accordance with one or more example embodiments described and recited herein.

FIG. 6A illustrates an overview of a load side connection using the DPGS diverter 110 with separate meter socket 115 and circuit breaker panels 605. The power flow path shown in FIG. 6A may be implemented in accordance with any of the embodiments of FIGS. 1-5.

In FIG. 6A, GDPS diverter 110 has a load side connection at which energy management system 600 may be powered load side of utility meter 120. Power may flow from utility 100 to meter socket 115, through GDPS diverter 110 and through utility meter 120, and then exit GPDS diverter 110 through via wires 625, to supply the energy management system 600. Power may then flow from energy management system 600 through wires 630 back to GPDS diverter 110 and returns to meter socket 115, which supplies the circuit breaker panel 650 through wires 650. Residence loads 620 are powered through circuit breakers 610 and 615.

Figure 6B:
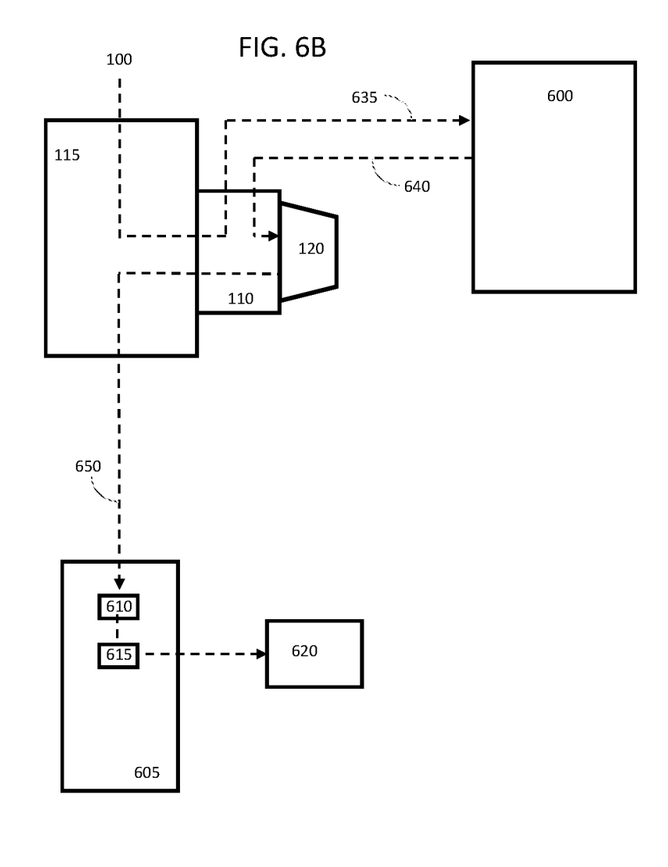
FIG. 6B illustrates a side angle view of an energy management system installed in conjunction with a residential standalone meter socket and separate load center AC panel with a GDPS Diverter interrupting power on a line side of a meter, in accordance with one or more example embodiments described and recited herein.

FIG. 6B illustrates an overview of a line side connection using the DPGS diverter 110 with separate meter socket 115 and circuit breaker panels 605. The power flow path shown in FIG. 6B may be implemented with any of the embodiments of FIGS. 1-5.

In FIG. 6B, GDPS diverter 110 has a line side connection at which energy management system 600 is powered line side of the utility meter 120. Power may flow from utility 100 to meter socket 115, through the GDPS diverter 110, and then exit GPDS diverter 110 through wires 635 to supply the energy management system 600. Power may then flow from energy management system 600 through wires 640 back to the GPDS diverter 110, through the utility meter 120, and return to meter socket 115, which supplies circuit breaker panel 650 through wires 650. Residence loads 620 are powered through circuit breakers 610 and 615.

FIGS. 5 and 6 illustrate that the diverter interconnection may be made either line side or load side of the utility meter, thus enabling metered or non-metered energy management system installations. This enables a wide range of applications for customer or utility owned distributed energy resource deployments.

Figure 7A:
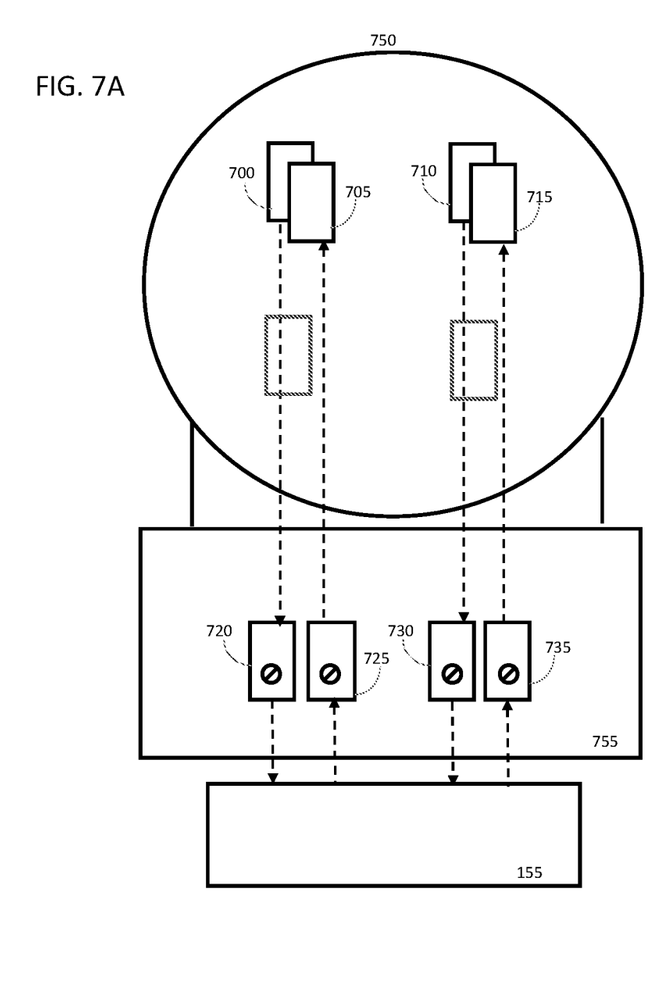
FIG. 7A illustrates a line side GDPS Diverter with screw terminals, in accordance with one or more example embodiments described and recited herein.

FIG. 7A illustrates a GPDS diverter with line side screw terminal connections for an energy management system, in accordance with one or more example embodiments described and recited herein.

Diverter housing 750 may include meter stab terminals 700 and 710 on a line side of meter electrical service. Stab terminals 700 and 710 may be electrically connected to screw terminals 720 and 730 that reside in junction box 755 that is attached to diverter housing 750. Energy management system 155 may be connected to screw terminals 720, 725, 730, 735 such that the service power flows to the system through terminals 720 and 730. Power may return to diverter 750 through terminals 725 and 735 and then flow to top meter jaws 705 and 715 in diverter 750. This configuration enables an energy management system line side connections for non-metered applications.

Figure 7B:
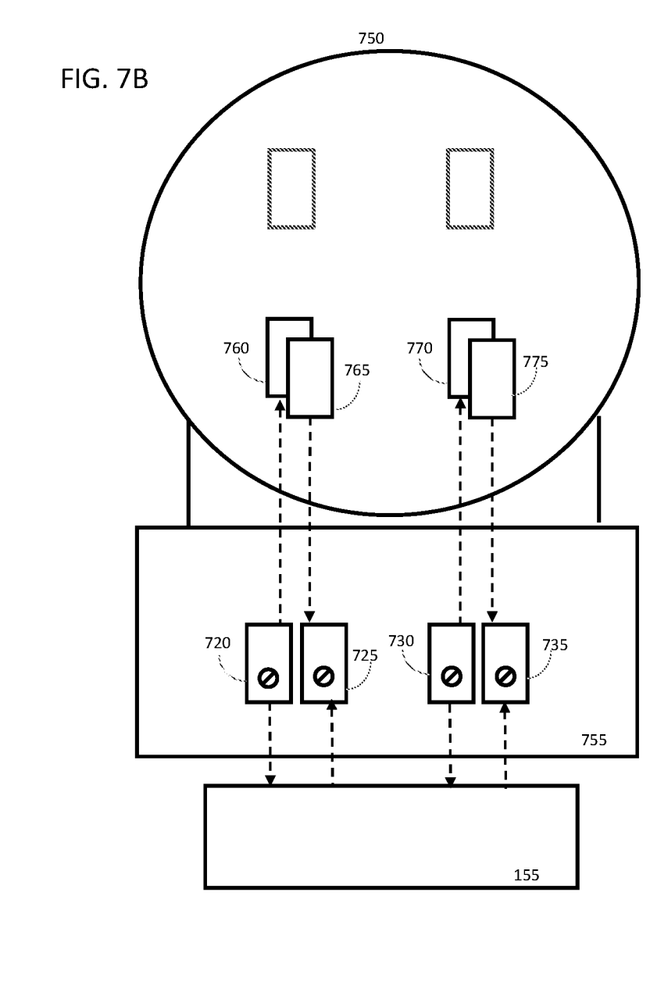
FIG. 7B illustrates a load side GDPS Diverter with screw terminals, in accordance with one or more example embodiments described and recited herein.

FIG. 7B illustrates a GPDS diverter with load side screw terminal connections for the energy management system 155, in accordance with one or more example embodiments described and recited herein. Diverter housing 750 may include meter jaw terminals 765 and 775 on a load side of the meter electrical service. These jaw terminals 765 and 775 are electrically connected to screw terminals 725 and 735 that reside in a junction box 755 that is attached to the diverter housing 750. The energy management system 155 may be connected to the screw terminals 720, 725, 730, 735 such that the service power flows to the system through terminals 725 and 735. Power may return to diverter 750 through terminals 720 and 730 and then flows to the bottom meter stabs 760 and 770 in the diverter 750. This configuration enables energy management system load side connections for metered applications.

We claim:

1. A meter socket adapter configured to be connected between a meter socket and a utility meter, comprising:
   first contacts to mechanically and electrically connect with utility supply-side contacts of a meter socket enclosure;
   second contacts to mechanically and electrically connect with consumer load-side contacts of the meter socket enclosure;
   third contacts to mechanically and electrically connect an external circuit; and
      a configuration to reroute a flow of power from either a utility supply-side or a consumer load-side of the utility meter, out of the meter socket adapter to the external circuit, and back into the meter socket adapter on the respective supply-side or the load-side of the utility meter,
   wherein the configuration comprises a bypass switch in series with service entrance conductors,
   wherein the bypass switch is configured to be closed to pass through power to a consumer side of the meter socket when the external circuit is disconnected, and when the external circuit is connected, the bypass switch is configured to be opened so that the power flows out of the meter socket adapter to the external circuit and back to the meter socket adapter to supply power to the consumer side of the meter socket.

2. The meter socket adapter of claim 1, wherein the meter socket adapter is configured to be removably connected to a metered or non-metered external circuit, wherein the external circuit is configured for integrating distributed energy resources.

3. The meter socket adapter of claim 1, wherein the external circuit comprises a plug, wherein the plug includes an integral actuator that is configured, upon insertion into a socket in the meter socket adapter, to open the bypass switch and fourth contacts to mechanically and electrically connect to the third contacts when the external circuit is connected to the meter socket adapter.

4. The meter socket adapter of claim 1, wherein the bypass switch is provided in series with the consumer supply-side service conductor of the utility meter.

5. The meter socket adapter of claim 1, wherein the bypass switch is provided in series with the utility load-side service conductor of the utility meter.

6. A method of diverting power flow using a meter socket adapter, the meter socket adapter comprising first contacts to mechanically and electrically connect with utility supply-side contacts of a meter socket enclosure, second contacts to mechanically and electrically connect with consumer load-side contacts of the meter socket enclosure, and third contacts to mechanically and electrically connect to an external circuit on a supply-side or load-side of the utility meter, wherein the method comprises:
   connecting the external circuit to the meter socket adapter to open a bypass switch in the meter socket adapter, and
   diverting power between a utility supply-side and a consumer load-side by passing the power out of the meter socket adapter to the external circuit, and then back into the meter socket adapter to supply power to a consumer side of the meter socket.

7. The method of claim 6, further comprising:
   disconnecting the external circuit from the meter socket adapter to close the bypass switch in the meter socket adapter, and
   passing the power to the consumer side of the meter socket.

8. The method of claim 6, wherein the external circuit comprises a plug, and the method further comprises connecting the external circuit to the meter socket adapter, the connecting further including inserting the plug that includes an integral actuator into a socket in the meter socket adapter to open the bypass switch.

9. The method of claim 6, wherein the bypass switch is provided in series with the consumer load-side service conductor of the utility meter.

10. The method of claim 6, wherein the bypass switch is provided in series with the utility line-side service conductor of the utility meter.

* * * * *